US007457335B2

(12) United States Patent
Randlett

(10) Patent No.: US 7,457,335 B2

(45) Date of Patent: Nov. 25, 2008

(54) FAST LOOP LASER DIODE DRIVER

(75) Inventor: Richard Randlett, Palo Alto, CA (US)

(73) Assignee: Exar Corporation, Fremont, CA (US)

(*) Notice: Subject to any disclaimer, the term of this patent is extended or adjusted under 35 U.S.C. 154(b) by 17 days.

(21) Appl. No.: 11/356,598

(22) Filed: Feb. 17, 2006

(65) Prior Publication Data

US 2007/0195835 A1 Aug. 23, 2007

(51) Int. Cl.
*H01S 3/00* (2006.01)

(52) U.S. Cl. .............. 372/38.02; 372/38.01; 372/38.04; 372/38.07

(58) Field of Classification Search ............... 372/38.04
See application file for complete search history.

(56) References Cited

U.S. PATENT DOCUMENTS 4,855,988 A * 8/1989 Shinbayashi et al. ... 372/29.021
4,899,344 A * 2/1990 Shibata et al. ........... 372/38.04
5,675,600 A * 10/1997 Yamamoto et al. ....... 372/38.01
5,887,010 A * 3/1999 Arai ........................ 372/38.04
2003/0160636 A1 8/2003 Fattaruso
2005/0129075 A1 6/2005 Anderson et al.

OTHER PUBLICATIONS

International Search Report for PCT/US07/62300, dated Feb. 14, 2008, 7 pages.

* cited by examiner

*Primary Examiner*—Minsun Harvey
*Assistant Examiner*—Sean Hagan
(74) *Attorney, Agent, or Firm*—Fliesler Meyer LLP

(57) ABSTRACT

A laser diode driver circuit can comprise fast loop portion and a closed-loop portion. The closed-loop driver portion can provide a part of the current for a laser diode. The closed-loop drive portion output can be independent of a photodetector. The fast-loop driver portion can provide a second part of the current for the laser diode. The fast-loop driver portion can use the output of the photodiode to determine the output of the fast-loop driver portion.

22 Claims, 3 Drawing Sheets

FAST LOOP LASER DIODE DRIVER

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

FIELD OF THE INVENTION

The invention relates generally to laser diode drivers, and more particularly to a fast-loop laser diode driver.

BACKGROUND

Disc drives with the capability of recording onto compact discs (CDs) and/or digital versatile discs (DVDs) are tremendously popular. Writing on a disc is a very precise operation, necessitating tight control of the laser with constant power output. This is rendered somewhat problematic by the fact that a laser diode is a relatively unstable device with an efficiency that varies with time and temperature. Laser diodes are also susceptible to an aging process that affects their performance.

In DVD and CD recordable drives, the laser power delivered to the media in the write and read modes is controlled by a very low frequency power monitoring feedback loop. Based on the feedback, the current through the diode is appropriately regulated. The need for the feedback loop arises from the variation of the laser diode's efficiency with time and temperature. The event that is being sampled by the feedback loop is a laser light pulse with a width that is typically less than 10 nanoseconds. The bandwidth of the feedback loop is rather low, typically less than 100 kHz. Also, known as an automatic power control (APC), this feedback loop captures the amplitude of each level of drive operation (for example, read, erase, write, and anneal). Based on the current active drive operation mode, the appropriate control voltage is then fed back to the laser diode driver (LDD). Typically one channel will be needed for each level of drive operation mode.

FIG. 1 shows an existing implementation of the loop involve an APC circuit 102 that monitors a small fraction of the laser beam such as with optical feedback 104 via a partially deflecting mirror. The pulse-pattern output of the APC 102 is transmitted down a pickup head flex cable to the motherboard where a sample-and-hold circuit, such as A/D converter 100, captures the respective levels. Further digital signal processing at Digital Signal Processor (DSP) 108 ensures and control signals are fed back to the LLD 112. The fundamental speed limitation of this architecture lies in the response time of the APC/sample-and-hold combination and the need to transmit very fast rise time pluses down the flex.

Several problems are evident in the existing approaches, including temperature sensitivity, nonlinearity, and noise. All power is concentrated in small areas of the device. With several channels, the device will have several hot spots that generate thermal gradients and create thermal instabilities. Accordingly, the temperature of the chip will depend on the current operating mode. Another problem is that as the voltage rises, the diode behaves less like a conventional diode and more like an open-loop current mirror or a short-circuit. Nonlinear effects result, negatively impact the device's operation. Any noise that may be generated is multiplied by a large factor. This large amount of gain also produces inherent nonlinearities in the current transfer function. Current compliance problems result and may substantially interfere with operation of the device. Also, inevitably, the longer the flex, the more noise is introduced, and also the more cost.

BRIEF DESCRIPTION OF THE DRAWINGS

Preferred embodiment(s) of the present invention will be described in detail based on the following figures, wherein.

DETAILED DESCRIPTION

Figure 1:
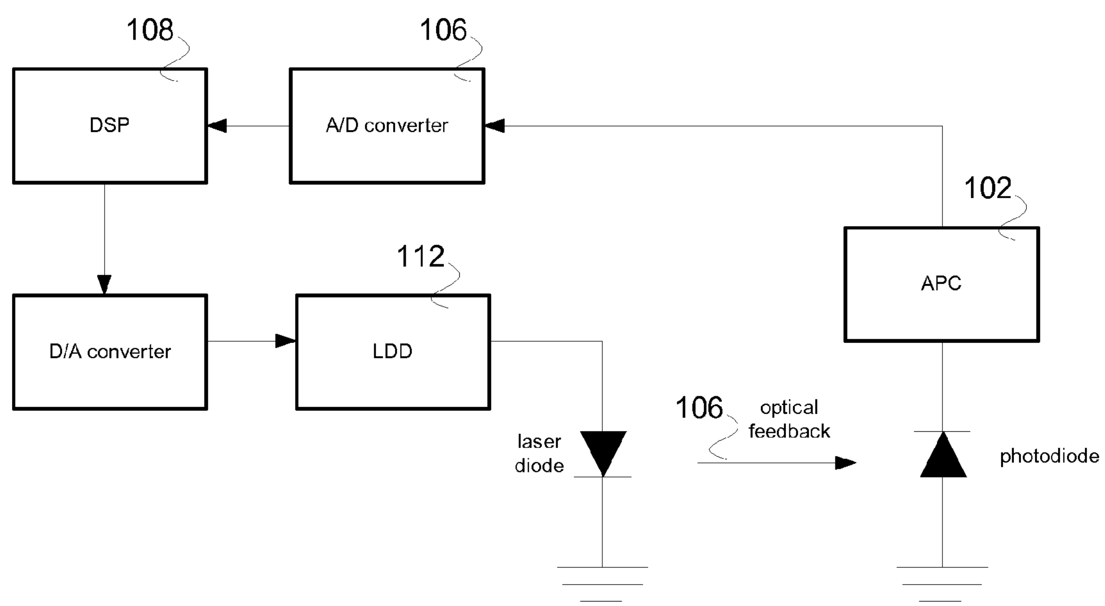
FIG. 1 is a diagram of a prior art laser diode driver system.
Figure 2:
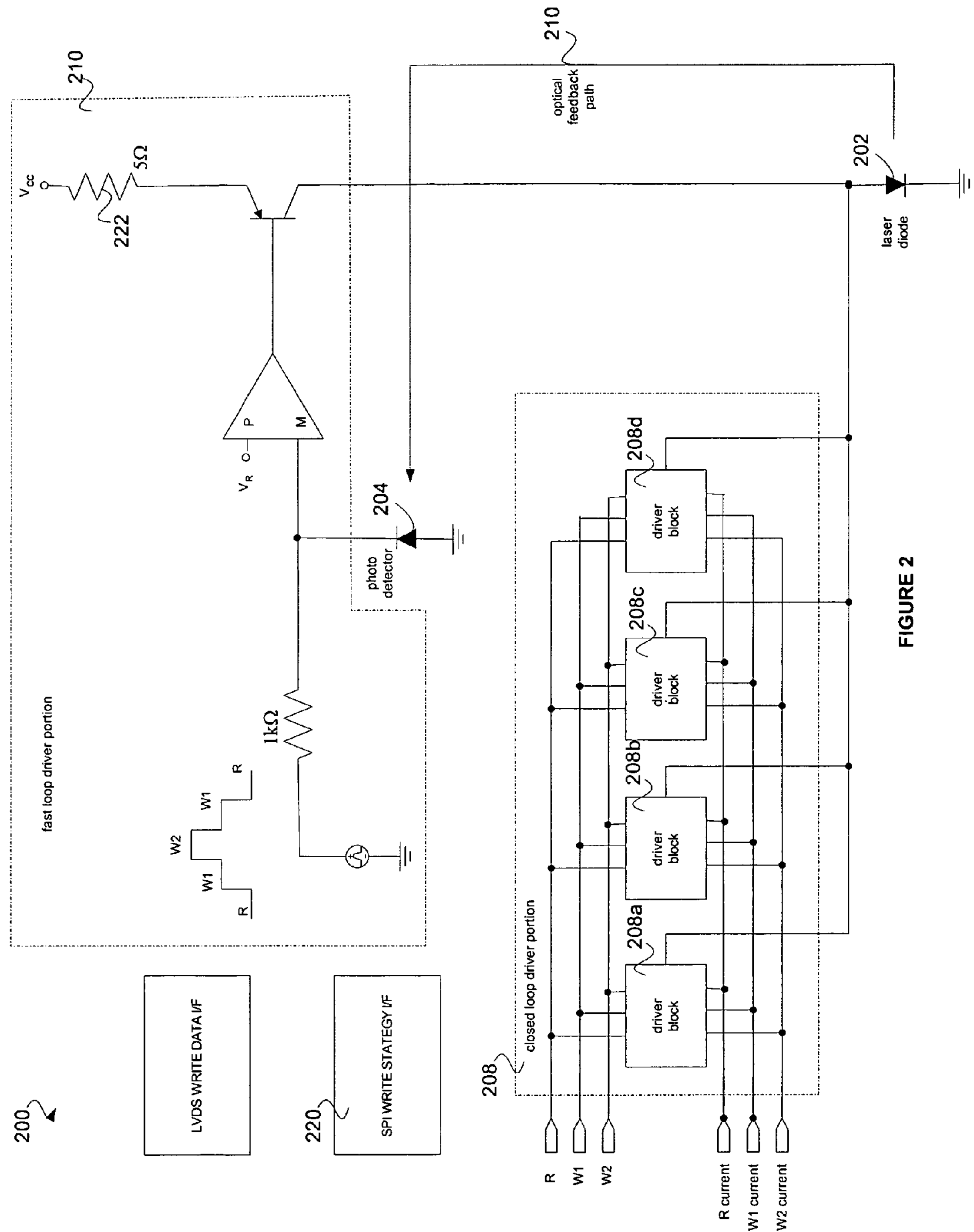
FIG. 2 is a diagram of an exemplary laser diode driver system of the present invention.

FIG. 2 is a diagram of a laser diode driver circuit 200 of one embodiment. A Laser Diode 202 is used to provide optical power for use in a device such as a CD Player or a DVD Player. A photodetector 204, such as a photodiode, can receive optical feedback 206 from the laser diode 202. The optical feedback 206 can be deflected using an optical element, (not shown) that directs a fixed percentage of the optical power from the laser diode 202 to the photodetector 204.

The laser diode 202 can be provided current from two different types of elements: A closed-loop driver portion 208 and a fast-loop driver portion 210. The closed-loop driver portion 208 output is independent of the photodetector 204. The closed-loop driver portion 208 can provide the majority of the nominal current for the laser diode 202. In one embodiment, 80% or more of the nominal current for the laser diode 202. The fast-loop driver portion 201 does receive feedback from the photodetector 204. The fast-loop driver portion can use this feedback to adjust the current to the laser diode 202 to reflect the changes in the laser diode 202 output versus current. Since the closed-loop driver portion 208 provides a part of the current to the photodiode 202, the fast-loop driver portion does not have to work as hard to send the current at the photodiode 202.

The use of both the closed-loop driver portion 208 and fast-loop driver portion 210 can provide a number of advantages. The total noise can be kept low since the fast-loop driver portion 210 only need provides a part of the current. The output of the closed-loop driver portion 208 can be very low noise. The closed-loop driver portion 208 can be quite fast so the speed of the entire driver circuit is improved (in one embodiment with a rise time of under a nanosecond).

The closed-loop drive portion 208 can include multiple driver blocks, such as driver blocks 208*a*, 208*b*, 208*c* and 108*d*. These driver blocks can be substantially identical with essentially the same maximum output current. The driver blocks can combine their outputs to produce the output of the closed-loop driver portion 208.

The laser diode driver circuit can have a number of channels or output modes. These modes can include read, write 1, write 2. Additional modes can include erase and anneal. Each mode can be associated with a desired level of optical power from the laser diode 202. In one embodiment, both the closed-loop driver portion 208 and fast-loop driver portion 210 can have their output adjusted for the different modes.

Figure 3:
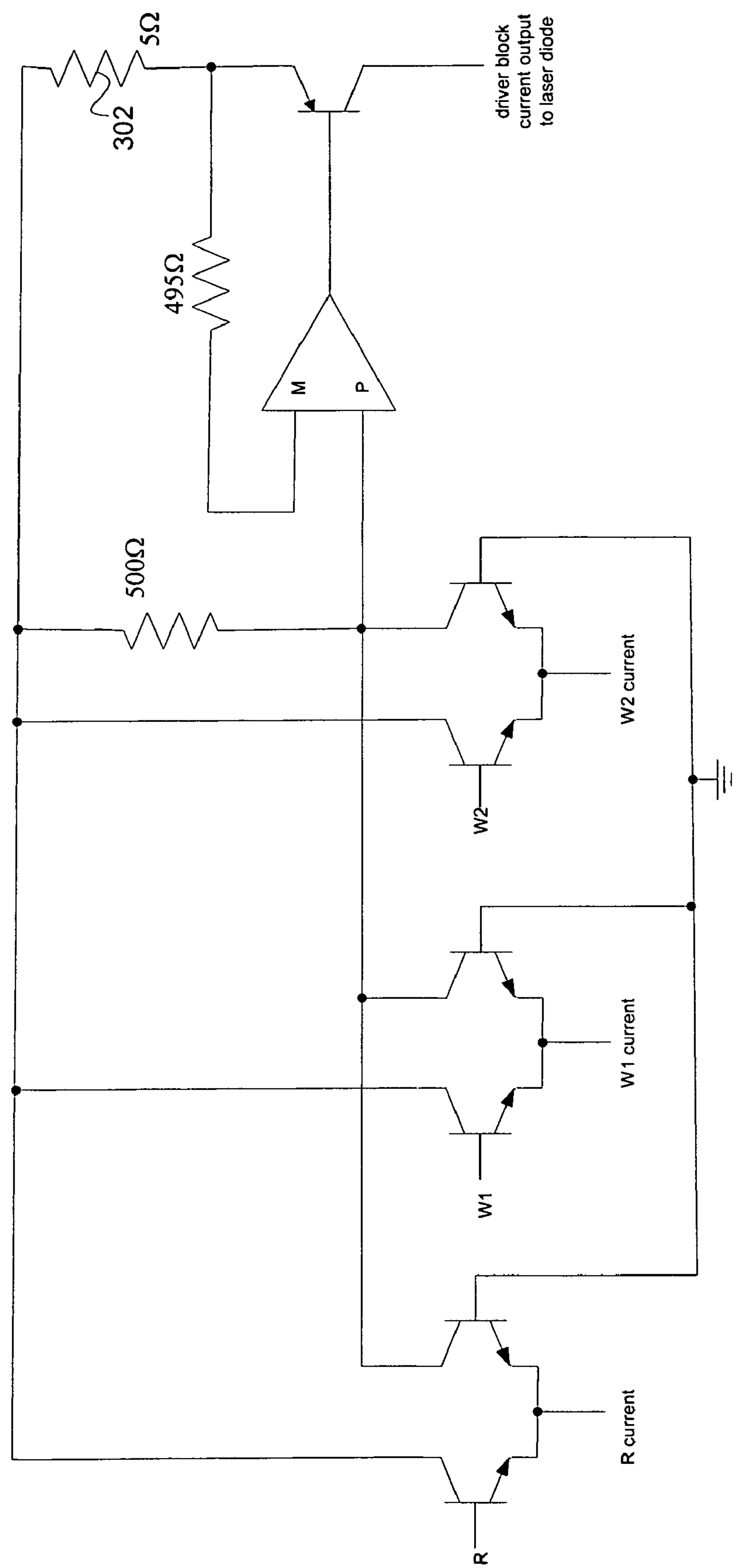
FIG. 3 is a diagram of an exemplary driver block of one embodiment to be used with the system of FIG. 2.

FIGS. 2 and 3 shows details of one embodiment of the fast-loop driver portion 210 and closed-loop driver portion 208, but other designs can also be used in the system of the present invention.

One embodiment of the present invention discloses "fast-loop" laser diode driver (LDD) that samples a pulse in real time and uses a fast feedback loop capable of almost instantaneously controlling the optical power output. The invention can eliminate the need for transmitting wide-band analog data down a flex. In addition, a new LDD architecture is proposed that employs a closed-loop current driver that has significantly lower noise than conventional current mirror architectures in use today.

The architecture of the new LDD can include a plurality of driver blocks, each of which can have the same maximum output current capability. According to one embodiment, the maximum output current is approximately 125 mA. Each driver block can be programmed to drive each of the channels, each of which corresponds to a different driver operation mode.

One additional current driver can be in a fast feedback loop that monitors the laser output power. This current driver adjusts in real time the output level of each driver block to conform to the amplitude-modulated pulse pattern it receives from the write strategy generator. The full-scale output capability of this driver can be set to allow for the expected range of laser diode current in accordance with the times and temperatures under which the device is operated. The fast-loop driver portion can maintain the output power constant at a constant level. It can be associated with a photodetector that measures a small portion of the light emitted by the laser in order to monitor the power and feeds the results back to the LDD blocks. A digital signal processing controller (not shown) can control a D/A converter and with reference to the LDD's transfer function, adjust the full-scale current of the laser diode driver as needed.

According to a set of embodiments of the invention, the write strategy generator can be controlled via a serial peripheral interface (SPI) port 202. The write strategy generator 220 can comprise a serial shift register that controls the LDD write pulse pattern. The driver can include an array of digital/analog converters, each of which controls in real time the pulse amplitudes for one of the driver operation modes or channels. FIG. 2 illustrates an example using three driver operation modes and four driver blocks. The number of channels and the number of driver blocks may be varied.

The invention can maintain constant power while compensating for variations due to changes in temperature and due to the aging properties of the diode. When, as in typically the case in CD or DVD applications, the laser bandwidth is very low, for example, approximately 10 khz, the monitored event can be a ten-nanosecond pulse.

The power dissipation can be uniform across the chip because each drive block 208*a*, 208*b*, 208*c* and 208*d* can dissipate an equal amount of power regardless of the total being delivered.

A photodetector can be placed in close proximity to the laser diode to facilitate optical feedback. The photodetector and the write pulse generator can feed into the fast-loop driver portion 208. The fast-loop driver portion 208 can deliver a small percentage of total required current (as an example, approximately 10%) and the driver blocks deliver the vast majority of the current (as an example 90%). As shown in FIG. 3, each driver block can be a closed loop current source that delivers constant current over a wide range of voltages across the laser diode.

Reliable current delivery by the transistor can be assured by the placement of the metering resistor 302. The metering resistor 302 can have a resistance, as an example of approximately 5 ohms. The voltage drop across the metering resistor 302 can be programmed by the driver blocks using programming currents.

The noise associated with the device 200 is mainly from the fast-loop driver portion 210. If as an example, the current inside the loop is 10% of total current, the noise will similarly be no more than 10% of the noise that would exist with other approaches. The circuit can represents a true closed-loop current source, with much loser noise and a high degree of linearity. The fast-loop driver portion 210 can deliver a correction current to maintain the optical output power at a constant level.

Since the fast-loop driver portion 210 only needs to deliver a small percentage (as an example, approximately 10%) of the total current, the system only has to settle to within 10% of its final value to achieve a settlement to within 1% of the full current. Therefore, the driver according to the invention are quite stable in terms of current. If as discussed above, the rise time for the laser diode is 10 nanoseconds, the fast-loop devices will have arise time of 1 nanosecond or less. The combination of speed and low noise and precision is not available in existing art.

The foregoing description of preferred embodiments of the present invention has been provided for the purposes of illustration and description. It is not intended to be exhaustive or to limit the invention to the precise forms disclosed. Many modifications and variations will be apparent to one of the ordinary skill in the relevant arts. The embodiments were chosen and described in order to best explain the principles of the invention and its partial application, thereby enabling others skilled in the art to understand the invention for various embodiments and with various modifications that are suited to the particular use contemplated. It is intended that the scopes of the invention are defined by the claims and their equivalents.

What is claimed is:

1. A laser diode driver circuit comprising:

a laser diode;

a photodetector adapted to receive optical feedback from the laser diode;

a closed-loop driver portion to provide a part of the current for the laser diode, the closed-loop drive portion output being independent of the photodetector; and a fast-loop driver portion to provide a second part of the current for the laser diode, the fast-loop driver portion using the output of the photodiode to determine the output of the fast-loop driver portion;

wherein the closed loop driver portion provides part of the current for the laser diode during a read mode.

2. The laser diode driver of claim 1, wherein the closed-loop driver portion comprises multiple driver blocks.

3. The laser diode device of claim 2, wherein the multiple driver blocks are substantially identical.

4. The laser diode device of claim 2, wherein the multiple driver blocks combine their currents to provide the closed-loop driver portion output.

5. The circuit of claim 2, wherein each of the driver blocks has essentially the same maximum output current.

6. The circuit of claim 1, wherein the laser diode driver has a number of channels with different currents provided to the laser diode for each channel.

7. The circuit of claims 1, wherein the fast-loop drive portion delivers no more than approximately 20% of the total nominal current used to operate the laser.

8. The circuit of claim 1, wherein the rise time of the circuit is no more than approximately one nanosecond.

9. The circuit of claim 1, wherein driver operation modes include a read and write.

10. The circuit of claim 9, wherein the driver operation modes further comprise a second write mode, an erase mode and an anneal mode.

11. The circuit of claim 1, wherein the laser diode driver client is used in a compact disc (CD) Player.

12. The circuit of claim 1, wherein the laser diode driver circuit is used in a digital versatile disc (DVD) Player.

13. A laser diode driver for connection to a laser diode and a photodetector comprising:

a closed-loop driver portion to provide a part of the current for the laser diode, the closed-loop driver portion output being independent of the photodetector; and a fast-loop driver portion to provide a second part of the current for the laser diode, the fast-loop driver portion using the output of the photodiode to determine the output of the fast-loop driver portion;

wherein the closed loop driver portion provides part of the current for the laser diode during a read mode.

14. The laser diode driver of claim 13, wherein the closed-loop driver portion comprises multiple driver blocks.

15. The laser diode device of claim 13, wherein the multiple driver blocks are substantially identical.

16. The laser diode device of claim 13, wherein the multiple driver blocks combine their currents to provide the closed-loop driver portion output.

17. The circuit of claim 13, wherein each of the driver blocks has essentially the same maximum output current.

18. The circuit of claim 13, wherein the laser diode driver has a number of channels with different currents provided to the laser diode for each channel.

19. The circuit of claims 13, wherein the fast-loop drive portion delivers no more than approximately 20% of the total nominal current used to operate the laser.

20. The circuit of claim 13, wherein the rise time of the circuit is no more than approximately one nanosecond.

21. The circuit of claim 13, wherein driver operation modes include a read and write.

22. The circuit of claim 21, wherein the driver operation modes further comprise a second write mode, an erase mode and an anneal mode.

* * * * *